United States Patent
Shemesh et al.

(10) Patent No.: US 7,161,158 B2
(45) Date of Patent: Jan. 9, 2007

(54) SYSTEM AND METHOD FOR FAST FOCAL LENGTH ALTERATIONS

(75) Inventors: Dror Shemesh, Hod Hasharon (IL); Dubi Shachal, Rehorot (IL)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 10/492,393

(22) PCT Filed: Oct. 9, 2002

(86) PCT No.: PCT/US02/32424

§ 371 (c)(1),
(2), (4) Date: Sep. 23, 2004

(87) PCT Pub. No.: WO03/032022

PCT Pub. Date: Apr. 17, 2003

(65) Prior Publication Data

US 2005/0017192 A1 Jan. 27, 2005

Related U.S. Application Data

(60) Provisional application No. 60/328,453, filed on Oct. 10, 2001.

(51) Int. Cl.
- H01J 3/14 (2006.01)
- H01J 37/21 (2006.01)
- H01J 3/28 (2006.01)
- H01J 37/256 (2006.01)

(52) U.S. Cl. ............... 250/396 R; 250/310; 315/111.61
(58) Field of Classification Search ............ 250/396 R, 250/310, 306, 307; 315/111.61
See application file for complete search history.

(56) References Cited

U.S. PATENT DOCUMENTS

| 4,438,336 | A | * | 3/1984 | Riecke | 250/398 |
| 4,766,314 | A | * | 8/1988 | Jung | 250/296 |
| 5,089,699 | A | * | 2/1992 | Ose et al. | 250/306 |

* cited by examiner

*Primary Examiner*—Nikita Wells
(74) *Attorney, Agent, or Firm*—Tarek N. Fahmi

(57) ABSTRACT

An apparatus and method for fast changing a focal length of a charged particle beam the method comprising the step of changing a control signal in response to a relationship between the control signal voltage value and the focal length of the charged particle beam.

20 Claims, 5 Drawing Sheets

SYSTEM AND METHOD FOR FAST FOCAL LENGTH ALTERATIONS

RELATED APPLICATIONS

The present patent application is a non-provisional application of International Application No. PCT/US02/32424, filed Oct. 9, 2002, which claims priority from U.S. Provisional Application 60/328,452 filed Oct. 10, 2001, which is herein incorporated by reference.

FIELD OF THE INVENTION

The invention relates generally to charged particle beam imagers, such as scanning electron microscopes and the like and especially for a system and method for fast focal length adjustments.

BACKGROUND OF THE INVENTION

The focal length of charged particle beams, such an electron beams, ion beams and the like, is usually controlled by an objective lens being fed by a control current. Prior art objective lenses are characterized by a relatively large response period. For example, the frequency response of a common objective lens has a cutoff at about 10 Hz. Accordingly; the objective lens cannot be utilized for fast changes of the focal length.

There is a need to provide a system and method for fast adjustment of the focal length of a charged particle beam.

SUMMERY OF THE INVENTION

The invention provides a system and method for fast focal length changes. The system and method control the focal length by changing the acceleration voltage. According to an aspect of the invention a primary acceleration voltage is supplied by a stable power source, the primary acceleration voltage is modulated by a modulation voltage to provide an acceleration voltage that is both relatively "clean" (high signal to noise ratio) and stable and can also be changed very rapidly. Preferably, the stable power source is operative to provide primary acceleration voltages that range between zero to hundreds, thousands and even ten thousands of volts. The modulation voltage is supplied by a controllable voltage supplier that supplies a modulating voltage that ranges between zero to one or two hundred volts.

According to an aspect of the invention the focal length system and method are utilized while imaging an object that is not perpendicular to the charged particle beam axis (a "tilted" object". The acceleration voltage modulation tracks a scanning signal that controls the location of the charged particle beam. Usually, the scanning signal of a tilted object resembles a periodic saw tooth signal. During each period the signal first rises and then falls. A relatively large bandwidth controllable power supplier is required for accurately tracking the relatively sharp fall of the signal.

According to an aspect of the invention the focal length can be changed at rates that exceed TV rates and can be utilized for objects that are tilted at a large range of angles.

According to an aspect of the invention the focal length is changed at rates that far exceed the rates of implementing auto focus techniques.

The invention provides a method for fast changing a focal length of a charged particle beam the method comprising the step of changing a control signal in response to a relationship between the control signal voltage value and the focal length of the charged particle beam.

The invention provides a method for scanning a tilted object with a charged particle beam, the method comprising the steps of: providing a charged particle beam having a focal length that substantially matches a predefined scanning path of the tilted object, wherein the focal length is responsive to a control signal and wherein fast changes in the focal length are generated by fast adjustments of the control signal.

The invention provides a system for fast changes in a focal length of a charged particle beam, the system comprising: a charged particle generator for generating a charged particle beam having a focal length that is responsive to a control signal; a control signal generator for providing a control signal for allowing fast changes of the focal length.

Conveniently, the control signal is an acceleration voltage, but other voltages, currents, can be of use. Conveniently, the step of changing is preceded by a step of calibration for determining the relationship between the acceleration voltage value and the focal length of the charged particle beam. The acceleration voltage comprises a primary acceleration voltage and a modulation voltage. The charged particle beam is an electron beam. The charged particle beam is focused by an objective lens and the fast changes are limited by a fast changing rate. The objective lens is operative to change the focal length of the charged particle beam at a rate that is slower than the fast changing rate. The fast changes are usually limited by a fast changing rate and wherein the fast changing rate exceeds 10 hertz. Conveniently, fast changing rate exceeds 10 kilohertz. Usually, the fast changes result from scanning a tilted object. The tilted object is tilted at an angle that does not exceed 45 degrees.

DETAILED DESCRIPTION OF THE INVENTION

Like every imaging device, the depth of focus (DOF) in Scanning Electron Microscope is limited. When the pixel size is smaller than the probe size, the DOF is limited by the numerical aperture of the objective lens, whereas in case where the pixel size is greater than the probe size, the DOF is limited also by the distance between adjacent pixels. When the distance (also termed "working distance) between an inspected object and an imaging apparatus, such as a SEM, varies over the inspected object, (such as in the case of a tilted object) the maximum field of view (FOV) that can be seen while keeping the sharpness similar all over the image, depends on the tilt angle.

Figure 1:
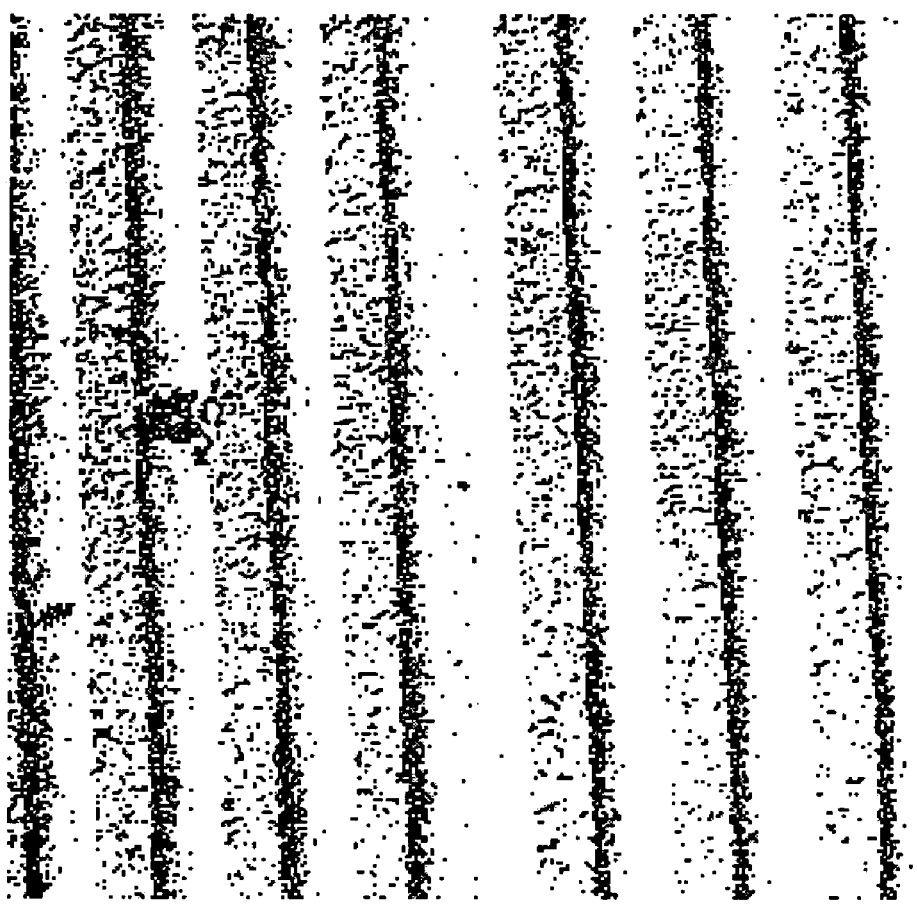
FIG. 1 is a schematic image of a tilted inspected object, being imaged without utilizing fast focal length alterations.

It is known in the art that smaller acceleration voltages result in smaller the DOF. Experiment showed that the maximum FOV that can be seen with the same sharpness over the whole image in tilt 45°, Vacc=600 V, is around 5 microns. It means that the DOF in these conditions is ±1.75 microns. As the search FOV for redetection is greater than 5 microns, redetection performance will degrade in tilt 45°. The image in FIG. 1 shows an example of the focus problem phenomenon in tilt 45 degrees, when there is no dynamic focus correction. It is clear that both upper and lower sections of the image appear obscure, not in focus, while only the lines in the mid part are sharp.

On the other hand, the beam energy can be changed very quickly, therefore, it is a preferable method for correcting the focus dynamically in large tilt angles.

Figure 2:
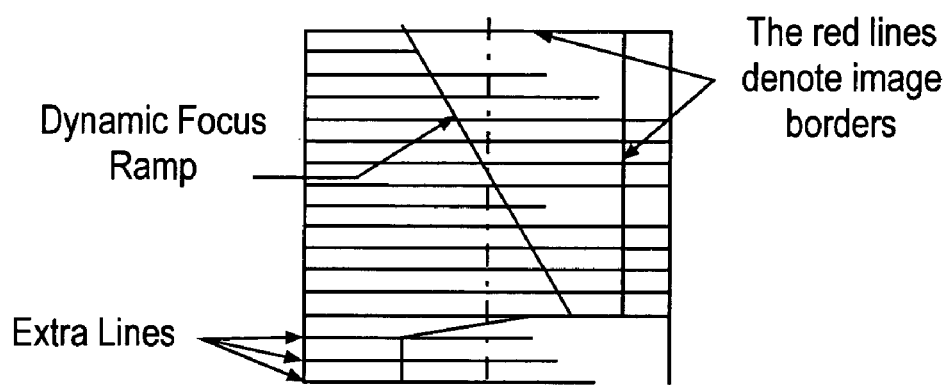
FIG. 2 is a schematic illustration of a scanning pattern of an image, in accordance with an aspect of the invention.
Figure 3:
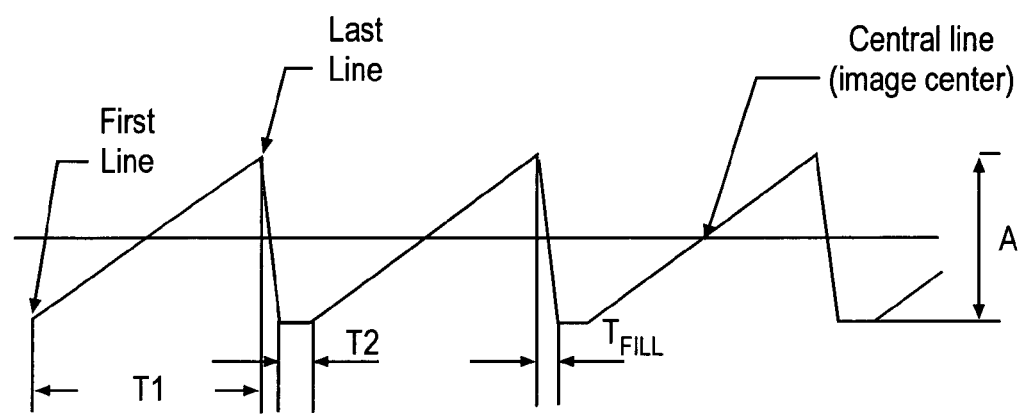
FIG. 3 is a schematic illustration of a scanning signal that may be utilized for imaging the image of FIG. 2, in accordance with an aspect of the invention.

FIGS. 3 and 2 describe the dynamic focus ramp during the scanning period in tilt. The ramp denotes the alternating electron beam energy (Vacc) during scan. FIG. 2 illustrates the scanning path of an electron beam that is used to produce an image that is bounded by rectangular 12. The horizontal lines 13 (including the lines that are located outside rectangular 12) illustrate the scanning path of an electron beam. The oriented line 14 denotes the focal length.

Figure 4:
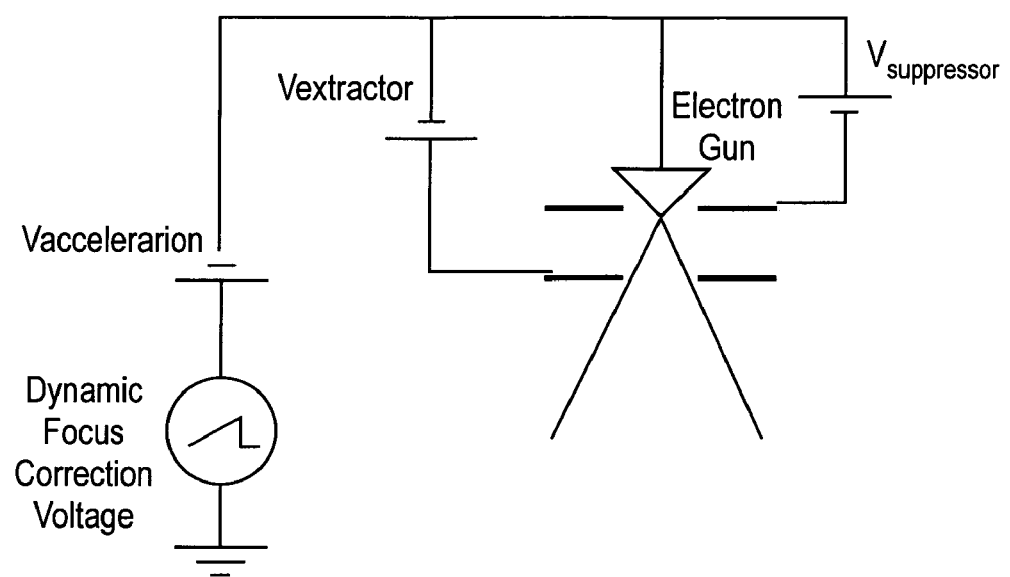
FIG. 4 is a schematic illustration of a power supplies and electron gun, in accordance with an aspect of the invention.

FIG. 4 illustrates an exemplary arrangement of power suppliers. The stable power supplies Vaccelerator, while the controllable power supply is an alternating current power supply that supplies signal within the range of (0 to ±200 V).

Controllable power supply 30 is connected in series to Vaccelerator 32. Vaccelerator 32, Vextractor 34 and Vsupressor 38 are connected to various parts of an electron gun and to electrodes (such as 40 and 42), to provide a required voltage scheme for allowing fast changes in the DOF of the charged electron beam extracted from the electron gun 36.

According to an aspect of the invention a calibration step is performed prior to the scanning. The calibration "maps" modulation voltage values to focal length values. The calibration step is used to match modulation voltage values to scanning patters.

The following is an exemplary calibration step that is utilized to match between modulation voltage values and a scanning pattern of a 45° tilted object.

$$DynamicFocusRampAmplitude = \Delta WD \cdot \frac{\Delta Vacc}{\Delta z} \cdot BitToVolt \qquad 1.$$

where, $$\Delta WD = 0.7071 \cdot FOV$$

2.

$$\frac{\Delta Vacc}{\Delta z} = a + b \cdot Vacc,$$

where Vacc is measured in kV.

a and b are a pair of constants. Its values depend on Vacc.

The parameter that needs to be calibrated is $$\frac{\Delta Vacc}{\Delta z}.$$

Actually, it is a measure of the chromatic aberration coefficient. As the chromatic aberration coefficient changes from column to column, one cannot put a fix value for this parameter, and it has to be measured. The easiest way of measuring $$\frac{\Delta Vacc}{\Delta z}$$

is to deduce it from $$\frac{\Delta OLC}{\Delta z} \text{ and } \frac{\Delta Vacc}{\Delta OLC}.$$

$$\frac{\Delta Vacc}{\Delta z} = \frac{\Delta OLC}{\Delta z} \cdot \frac{\Delta Vacc}{\Delta OLC}$$

$$\frac{\Delta OLC}{\Delta z}$$

is measured on a step target containing steps of 50 microns height difference between each step.

Figure 5:
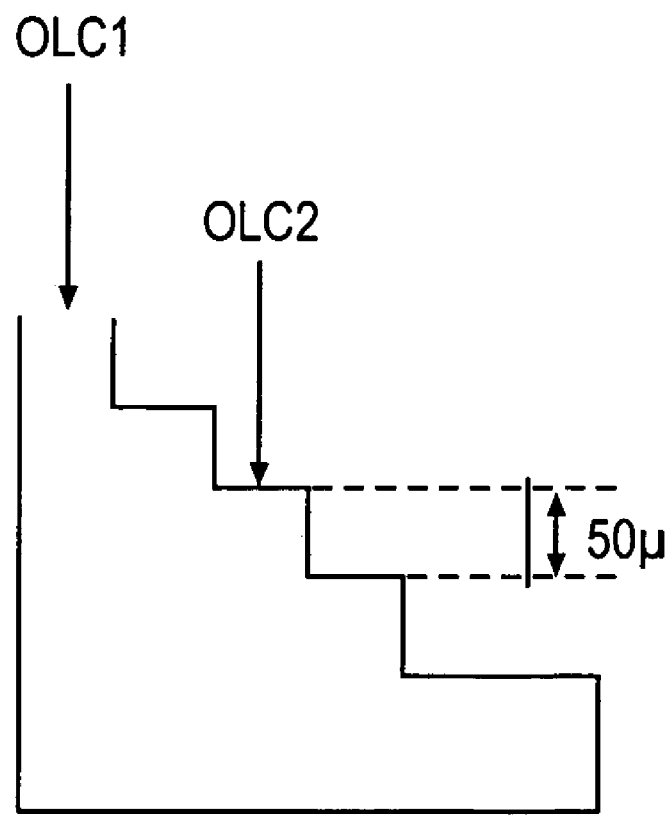
FIG. 5 is a side view of a calibration target, in accordance with an aspect of the invention.

Referring to FIG. 5, illustrating a calibration target that includes multiple steps 51, 52, 53 . . . , that are spaced apart by 50 microns. If OLC1 (61) is the objective lens current that is used to focus the beam on step 1 (51), and OLC3 is the objective lens current that is used to focus the beam on step 3, and step 3 is 100 microns higher than step 3, $$\frac{\Delta OLC}{\Delta z} = \frac{OLC1 - OLC3}{100 \ \mu m}$$

$$\frac{\Delta Vacc}{\Delta OLC}$$

is calculated by focusing on the same location in two different Vacc. If OLC4 uses to focus in Vacc4 and OLC5 uses to focus in Vacc5, and Vacc4−Vacc5=10V, $$\frac{\Delta Vacc}{\Delta OLC} = \frac{10V}{OLC5 - OLC4}$$

We claim:

1. A method for fast changing a focal length of a charged particle beam the method comprising the step of changing a control signal in response to a relationship between the control signal voltage value and the focal length of the charged particle beam, wherein the control signal is an acceleration voltage.

2. The method of claim 1 wherein the step of changing is preceded by a step of calibration for determining the relationship between the acceleration voltage value and the focal length of the charged particle beam.

3. The method of claim 1 wherein the acceleration voltage comprises a primary acceleration voltage and a modulation voltage.

4. The method of claim 1 wherein the charged particle beam is an electron beam.

5. The method of claim 1 wherein the charged particle beam is focused by an objective lens and wherein the fast changes are limited by a fast changing rate.

6. The method of claim 5 wherein the objective lens is operative to change the focal length of the charged particle beam at a rate that is slower than the fast changing rate.

7. The method of claim 1 wherein fast changes are limited by a fast changing rate and wherein the fast changing rate exceeds 10 hertz.

8. The method of claim 1 wherein fast changes are limited by a fast changing rate and wherein the fast changing rate exceeds 10 kilohertz.

9. The method of claim 1 wherein the fast changes result from scanning a tilted object.

10. The method of claim 9 wherein the tilted object is tilted at an angle that does not exceed 45 degrees.

11. A method for scanning a tilted object with a charged particle beam, the method comprising the steps of: providing a charged particle beam having a focal length that substantially matches a predefined scanning path of the tilted object, wherein the focal length is responsive to a control signal and wherein fast changes in the focal length are generated by fast adjustments of the control signal, wherein the control signal is an acceleration voltage.

12. A system for fast changes in a focal length of a charged particle beam, the system comprising: a charged particle generator for generating a charged particle beam having a focal length that is responsive to a control signal; a control signal generator for providing a control signal for allowing fast changes of the focal length, wherein the control signal is an acceleration voltage.

13. The system of claim 12 wherein the system is operative to determine a relationship between the acceleration voltage values and the focal length.

14. The system of claim 12 wherein the acceleration voltage comprises a primary acceleration voltage and a modulation voltage.

15. The system of claim 12 wherein the charged particle beam is an electron beam.

16. The system of claim 12 wherein the charged particle beam is focused by an objective lens and wherein the fast changes are limited by a fast changing rate.

17. The system of claim 16 wherein the objective lens is operative to change the focal length of the charged particle beam at a rate that is slower than the fast changing rate.

18. The system of claim 12 wherein fast changes are limited by a fast changing rate and wherein the fast changing rate exceeds 10 hertz.

19. The system of claim 12 wherein fast changes are limited by a fast changing rate and wherein the fast changing rate exceeds 10 kilohertz.

20. The system of claim 12 wherein the control signal provider comprises a stable power supply and a fast controllable power supply.

* * * * *